March 19, 1963 M. E. TALAAT 3,082,275
THERMOELECTRIC GENERATORS
Filed May 11, 1959 2 Sheets-Sheet 1

INVENTOR.
MOSTAFA E. TALAAT.
BY Herman Seid
ATTORNEY

THERMOELECTRIC GENERATORS

Filed May 11, 1959

2 Sheets-Sheet 2

*INVENTOR.*

MOSTAFA E. TALAAT.

*BY*

Herman Seid

ATTORNEY 3,082,275
Patented Mar. 19, 1963

3,082,275

THERMOELECTRIC GENERATORS

Mostafa E. Talaat, Fayetteville, N.Y., assignor to Carrier Corporation, Syracuse, N.Y., a corporation of Delaware Filed May 11, 1959, Ser. No. 812,170
7 Claims. (Cl. 136—4)

This invention relates to thermoelectric devices and in particular, to thermoelectric generators.

Since the advent of the commercial availability of suitable thermoelectric materials various proposals have been set forth for the conversion of heat energy into electricity. These proposed generators have suffered from various disadvantages including the low over-all efficiency involved in the conversion of heat of combustion into electrical energy, the difficulty of readily assembling and disassembling the generator for making tests and repairs, and the inability to control the output of the generator under various conditions of load or temperature.

It is an object of this invention to provide a satisfactory generator to overcome the deficiencies present in prior generators of this type.

It is a further object of this invention to provide a thermoelectric generator to convert heat into electrical energy with a high degree of over-all efficiency and minimum weight and volume per kilowatt generated.

It is a further object of this invention to provide a control arrangement for regulating the output of a thermoelectric generator.

It is a further object of this invention to provide a control arrangement to vary the heat input to the generator according to fluctuations in the output of the generator such as might be occasioned by changes in the external load imposed upon the generator or variations in the temperature, quality or quantity of the fluid delivered to it.

It is a further object of this invention to provide a heat exchanger for a thermoelectric generator wherein the heat of the exhausted gases produced by the fuel may be employed to increase the burner efficiency by preheating the combustion air.

It is a further object of this invention to provide a thermoelectric generator wherein the thermoelectric elements are heated by the radiant energy produced by the heat source and by being placed in heat exchange relationship with the exhausted gases produced by the heat source.

It is a further object of this invention to provide a thermoelectric generator wherein the thermoelectric elements are arranged in panels which form a polygonal chamber, whereby the panels may be separately assembled and disassembled for testing or repairing.

It is a further object of this invention to provide novel means for securing the individual thermoelectric elements in position. Other and further objects of this invention will become apparent by reference to the following description.

A thermoelectric generator constructed in accordance with this invention may comprise a plurality of generally flat thermoelectric panels removably assembled to form a generally closed polygonal chamber. A fuel burner may be mounted at one end of the polygonal chamber and serve to heat the thermoelectric panels by direct radiation. The hot gases produced by the burner are then exhausted through flues positioned in heat exchange relation with the thermoelectric panels so that some of the heat of the gases is recovered. The exhaust gases may then be passed in heat exchange relation with air supplied to the burner by passing the gases through another heat exchanger. The thermoelectric panels of the generator have a plurality of series connected thermoelectric elements of differing thermoelectric properties as for example alternating P-type and N-type elements arranged in the panel so that for a given direction of current flow through a series of the elements junctions of one type are on one side of the panel and junctions of the other type e.g., reverse order, are on the other side of the panel. The electrical connections for each series of thermoelectric elements may be brought out of the panels to a common terminal board for connection in any desired manner depending on the use to which the generator is to be put.

An electrical control circuit may be provided for use with the generator comprising a Zener diode which supplied a constant reference voltage against which a proportional fraction of the generator output voltage is compared by an amplifier. The output of the amplifier may be employed to automatically adjust servo-mechanisms which may control the burner air and fuel supply.

The attached drawings disclose a preferred embodiment of this invention, in which.

In the drawings, like numerals are used throughout to designate corresponding parts.

Figure 1:
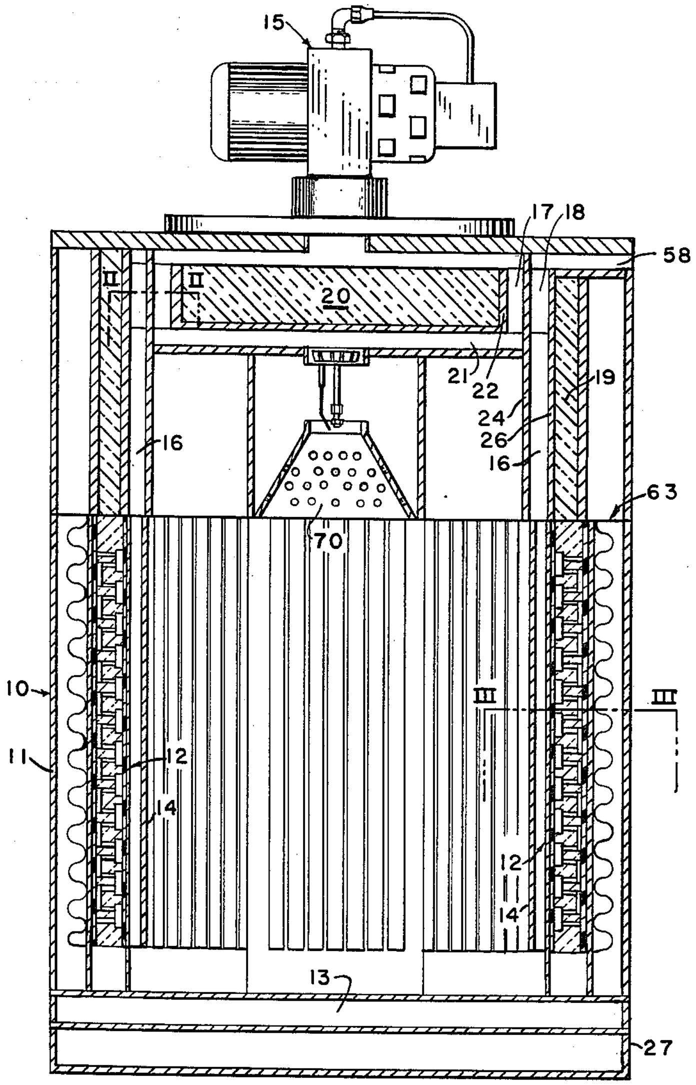
FIGURE 1 is a sectional view of the thermoelectric generator of the invention.

Referring particularly to FIGURE 1, there is shown a thermoelectric generator 10 having an outer shell 11 which may be cylindrical in form and made of any suitable material, such as stainless steel. The thermoelectric panels are designated generally at 12 and, as more readily seen in FIGURES 3 and 4, comprise a plurality of plates 30 and 36 in which are contained the thermoelectric elements 33. The panels 12 are arranged in the generator to form a substantially closed polygonal figure. Any desired number of these panels may be employed, but preferably eight such panels are used to form the vertical walls as partially shown in FIGURE 3. In order to utilize the space inside the generator to the best efficiency, the base 13, shown in FIGURE 1, may also comprise a thermoelectric panel. A plurality of heat exchange ducts 14 which may be integral with or secured to plate 30 are provided by which hot gases may be exhaused from the interior of the generator in heat exchange relationship with the thermoelectric panels 12. A variable output heat source, designated generally as 15, is provided such as one having a burner 70 employing air and suitable liquid fuel such as oil. Servo-mechanisms 60, 61 adjust the fuel supply to burner 70 and consequently adjust the heat output of heat source 15.

Figure 2:
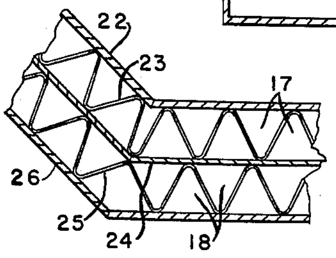
FIGURE 2 is a fragmentary sectional view taken on line II—II of FIGURE 1, showing the construction of the preheater.

The heat exchange ducts 14 extend upwardly and discharge into exhaust flue 16 in the upper part of the generator as shown in FIGURE 1. The upper portion 18, of exhaust flue 16 forms part of a preheater to pass the burner air supply in heat exchange relation with gas exhausted through flue 16. Air duct 21 supplies air to the burner. The upper portion 17 of air duct 21 is in heat exchange relationship with upper portion 18 of exhaust flue 16. Air duct 21 carrying combustion air to burner 15, is shown in FIGURE 2 as being of generally polygonal configuration at the heat exchange portion 17. Thermal insulation 19 is placed around flue 16 and thermal insulation 20 fills the chamber formed centrally of duct 17.

Referring now to FIGURE 2, which shows the detail of the preheater, interior walls 22 and 24 of the air duct 21 cooperate with an interior corrugated wall 23 to provide a number of axial paths or chambers 17 which comprise the upper portion 17 of the air duct through which air passes and is preheated by the hot gases which flow through upper portion 18 of exhaust flue 16. Interior wall 24 also separates the upper portion 18 of exhaust flue 16 from the upper portion 17 of air duct 21. The exhaust duct likewise has an interior corrugated member 25 providing a plurality of axial flow paths or chambers 18 between walls 26 and 24 and is similar in construction to the upper portion 17 of the air duct just described. An outer wall 26 completes the upper portion 18.

Base member 27 of the generator may retain a thermoelectric base panel 13 in place. Suitable means (not shown) may be employed in that event to facilitate removal of the base member and thermoelectric panel.

Figure 4:
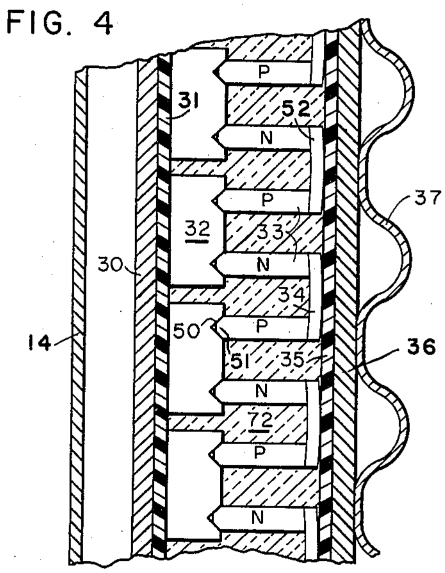
FIGURE 4 is a fragmentary sectional view taken on the line IV—IV of FIGURE 3, showing the means for retaining the thermoelectric elements in the generator.
Figure 3:
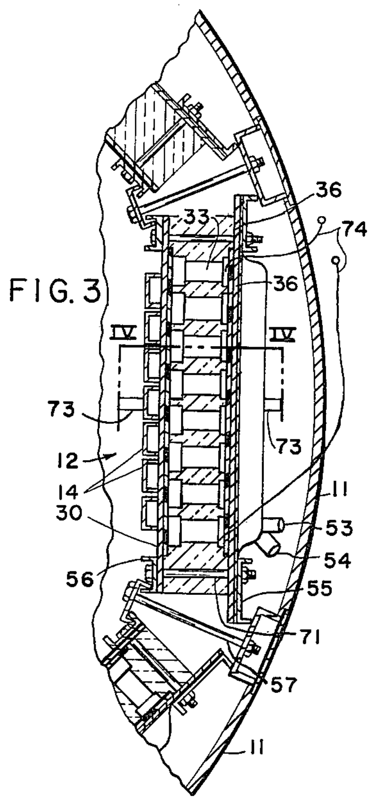
FIGURE 3 is a fragmentary sectional view taken on the line III—III of FIGURE 1.

Referring now to FIGURES 3 and 4 wherein the construction of the thermoelectric panels is shown in greater detail, 14 denotes a plurality of heat exchange ducts which may be welded or otherwise secured to hot side pressure plate 30 which may be conveniently made of stainless steel such as SAE 310. Next to pressure plate 30 is an electric insulation layer 31 of any suitable material, such as mica. An iron bridge or jumper 32 is provided between appropriate pairs of thermoelectric elements 33 at one end thereof.

As shown in FIGURE 4, jumpers 32 are provided with recesses 50 and thermoelectric elements 33 are formed with complementary projections 51 to be received in the recesses in the jumper. It will be understood that the recesses and projections may be of any convenient shape and may be formed in either member. It has been found that frustro-conical recesses in the jumper and complementary frustro-conical projections on the thermoelectric elements, which may be cylindrical in form, are satisfactory for the purposes of this invention.

The other ends of the thermoelectric elements 33 are secured to the jumpers 34 in alternating fashion with jumpers 32 to form a series connection between the elements 33, as will be understood by those skilled in the art. The thermoelectric elements 33 are arranged with one P-type element and one N-type element contacting each jumper 32 and 34 as shown in the drawing.

The cold jumper 34 comprises an outwardly dished plate of spring material such as a copper alloy and is joined to the thermoelectric elements by a solder junction such as tin-lead solder. Layer 35 of suitable electrical insulating material, such as mica, is interposed between cold side pressure plate 36 and jumpers 34. As shown in FIGURE 4, corrugated metal member 37 may be integral with or a separate plate secured to plate 36. Appropriate supply and discharge conduits 53 and 54, shown in FIGURE 3, are connected to member 37 to circulate a cooling material such as sea water in heat exchange relation with jumpers 34 to cool the junctions adjacent plate 36.

The cold side pressure plate 36 may be formed of cupronickel and is secured to the hot side pressure plate 30 in a convenient manner such as by fastening means 71 and bars 73 secured by other fastening means to complete the assembly. When the cold plate 36 is secured with respect to the hot plate 30, the spring metal of the jumpers 34 will be somewhat flattened as shown in FIGURE 4 from their normally outwardly dished shape and will serve to exert force on the thermoelectric elements 33 to hold them in the recesses 50 of jumpers 32. This assures a positive contact which resists thermal and mechanical shock. Each panel assembly forms an integral unit and may be shock-mounted if desired. The thermoelectric elements may be imbedded in a block of electrical and thermal insulating material such as isomica 72. In addition, a relatively poor thermally conducting inert or reducing atmosphere may fill the space between the panel walls 30 and 36 substantially replacing air which would otherwise remain between the plates of the panel. Various gaseous materials are satisfactory for this purpose, such as hydrogen, helium, argon or nitrogen. The entire panel assembly may then be hermetically sealed by gaskets (not shown).

Figure 5:
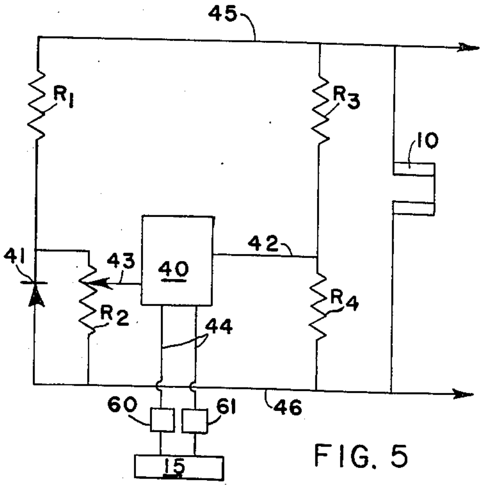
FIGURE 5 is a schematic diagram of the control means for the thermoelectric generator.

In FIGURE 5 there is schematically shown a control circuit for use with the generator previously described. The electrical output of thermoelectric generator 10 is carried by electrical conductors 45 and 46. Resistances R3 and R4 are connected in series across the generator output and provide a voltage-dividing network from which a predetermined fraction of the total voltage output of the generator may be provided at 42 and fed into an amplifier 40. Across the output terminals of the generator there is also placed a resistance R1 and a parallel circuit comprising a potentiometer R2 and a Zener diode 41. The voltage at the slider 43 of the potentiometer R2 is also fed into amplifier 40. The Zener diode characteristically breaks down at a predetermined potential difference across it and thereafter maintains the potential drop across it constant. By the proper selection of the values of resistance of R1 and R2, it is possible to maintain this condition at all times within the range of output voltages encountered in the use of the generator. With values chosen in this manner for resistance R1 and R2, the Zener diode maintains a constant voltage across the terminals of resistor R2, thereby providing a convenient and inexpensive means to obtain a constant reference voltage irrespective of the load imposed on the generator or fluctuations in generator output. A fraction of this reference voltage is supplied to amplifier 40 from slider 43 of potentiometer R2. The amplifier 40 serves to compare the reference voltage thus obtained at 43 to the voltage provided at 42 which fluctuates proportionally to the output of the generator. By adjusting the potentiometer R2, this voltage may be equalized with that of the voltage at 42 and the amplifier may then be caused to respond to differences between the fluctuating voltage at 42 and the reference voltage at 43. By amplifying this voltage difference servomotors 60 and 61 may be caused to operate and correspondingly adjust the fuel input to the burner unit 15 of the generator.

It is contemplated that the output of the generator may change either because of changed burner efficiency or changes in the quality of the fuel, erratic burner operation or because the external load imposed upon the generator causes its terminal voltage to change due to change in the effective load resistance. In such a case, the voltage at 42 fed into the amplifier will correspondingly change. This change will be sensed by the amplifier and will cause a signal to be fed to the servo-mechanisms controlling the fuel and air supply to the burner which in turn will change the supply of fuel and air in such manner as may be necessary to adjust the fuel and air consumption to yield a new heat rate corresponding to the new load condition. If desired, a battery (not shown) may be floated across the output of the generator in order to absorb the initial effect of an increased load.

Heat supplied by the burner to the thermoelectric elements will cause a potential difference at their junctions. The thermoelectric elements may be composed of any desired thermoelectric material such as semi-metals or semi-conductors, for example, lead telluride and are connected in pairs or couples having dissimilar thermoelectric properties.

Each of the thermoelectric junctions of a single panel and each panel may be connected in series with one another to provide a high voltage output or various combinations of series, and parallel arrangements of the panels may be provided by my unique construction depending upon the requirements imposed on the generator.

The electrical terminals 74 for each thermoelectric panel of the generator may be separately brought out of their respective panels to a common terminal board (not shown) and joined together in any desired series or parallel arrangements, or individual panels may be bypassed if desired. This flexible arrangement will also facilitate testing of the individual panels of the generator in the event of failure of any of the junctions since each panel may be separately tested.

It is a further feature of my invention that each of the thermoelectric panels, such as shown at 12, containing a number of junctions joined in series, may be made removable from the generator for replacement or testing. This removability feature as shown in FIGURE 3 may be provided by attaching joining flanges 55 and 56 at the ends of the pressure plates 30 and 36 of the panels. The flanges are held in position in the generator by appropriate fastening means 57 which as shown may secure shell 11 to the panels and which may be loosened when it is desired to remove a panel assembly. The panel assembly may be removed as a unit by pulling it vertically or sidewise out of the generator. In order to accomplish vertical removal of the panels, the top portion of the generator, including the burner and preheater assembly, may be made removable from the lower portion containing the panels as indicated by separation line 63 of FIGURE 1. Additional fastening means 71 may be provided at the sides of each panel assembly to draw the pressure plates toward each other and hold the panel assembly together.

It will be observed that the heat from the burner 70 of heat source 15 directly heats exposed portions of panels 12 by radiation. In addition to the heat provided spaced to the panels by radiation I have also provided heat exchange ducts 14 through which the hot exhaust gases of the burner are expelled to the exterior of the generator. In passing through the ducts 14 the hot gases give up a portion of their heat to the thermoelectric junctions adjacent plate 30 by convection and conduction through the walls of the panels as the hot exhaust gases flow upwardly through the ducts 14 to reach the preheater assembly shown at 18 of FIGURE 2. This heat exchange tends to maintain a uniform temperature over the entire area of the panel. As the hot gas passes through the plurality of ducts that comprise upper portion 18 it gives up an additional portion of its heat to the incoming air which passes through ducts 17, thereby serving to preheat the air and materially increase the burner efficiency before the hot gases are exhausted to the exterior through flue 58.

It can be seen that the generator described above provides an economical and efficient means of generating thermoelectric power, leading to the smallest weight and volume per kilowatt generated, overcoming the objections previously encountered in thermoelectric generators and provides a high power output with the least size, weight and heat supply for a given thermoelectric material.

While I have described a preferred embodiment of my invention, it will be appreciated that various modifications may be made by those skilled in the art without departing from the spirit and scope of my invention. I therefore do not wish to be limited to the construction shown since it may be otherwise embodied within the scope of the following claims.

I claim:

1. In a thermoelectric generator, a plurality of thermoelectric panels, each thermoelectric panel comprising a plurality of thermoelectric elements connected in series by means of a plurality of jumpers, said jumpers being located between and electrically insulated from a pair of plates forming an integral sub-assembly, means to removably retain individual thermoelectric subassemblies in said generator, said thermoelectric panels being arranged to form a combustion chamber having an inner wall, a burner having a hot gaseous exhaust, said burner being positioned to heat said thermoelectric panels adjacent one end thereof by direct radiation from said burner and means to exhaust the hot gaseous exhaust of said burner in heat exchange relationship with the thermoelectric panels of the generator, said means comprising at least one duct adjacent to one of the thermoelectric panels forming the inner wall of said combustion chamber, said duct being open at one end thereof within said combustion chamber lying adjacent the other end of said one thermoelectric panel and forming a path for the exhaust gases whereby the said gases are placed in convective heat exchange relation with the thermoelectric panels as the gases are exhausted from said generator to maintain a relatively uniform temperature.

2. A thermoelectric assembly comprising a pair of thermoelectrically dissimilar thermoelectric elements, a jumper connecting said dissimilar thermoelectric elements adjacent one of each of their ends, a pair of contacting members, one of said contacting members being adapted to contact one of said thermoelectric elements adjacent the other end thereof and the other of said contacting members being adapted to contact the other of said thermoelectric elements adjacent the other end thereof, said jumper comprising a conductor strap of electrically conducting material and including a normally outwardly dished spring-like portion, said jumper contacting said thermoelectric elements so that the outwardly dished portion thereof extends away from said thermoelectric elements, and means to exert a force on said outwardly dished spring-like portion of said jumper to tend to flatten the same thereby exerting a compressive force on said thermoelectric elements to maintain them in electrical and mechanical contact with their respective contacting members.

3. A thermoelectric panel assembly according to claim 2 wherein the means exerting a force on the jumper includes a pair of sheets of electrical insulation comprising said layers and fastening means to fix the relative position of said sheets of insulation thereby to exert said force on the jumper and on the thermoelectric elements to maintain them in contact with their respective contacting members.

4. In a thermoelectric generator for the production of electrical power, a plurality of thermoelectric elements connected in series relationship to form a plurality of thermoelectric junctions, means for supplying heat to said thermoelectric junctions, said means for supplying heat comprising a fuel combustion burner assembly, means for automatically regulating the supply of fuel to said burner assembly including means for automatically sensing the electrical output of said generator, means to provide a reference voltage, means to automatically compare the automatically sensed output of said generator with said reference voltage to obtain a signal corresponding to the difference therebetween and means to automatically actuate said regulating means in a direction to maintain a predetermined electrical output from said generator by adjusting the supply of fuel to said burner in accordance with the difference between said reference voltage and the sensed output of said generator.

5. A method of maintaining a predetermined electrical output of a thermoelectric generator of the type employing a combustible fuel burner heat source which consists in supplying fuel to said burner, igniting the fuel supplied to said burner, exposing said thermoelectric elements to heat obtained from ignition of said fuel, automatically sensing the electrical output of said thermoelectric generator, automatically comparing the automatically sensed output of said generator with a reference voltage to obtain a signal corresponding to the difference therebetween, and automatically varying the supply of fuel to said burner in accordance with said difference between said automatically sensed output and said reference voltage in a direction to maintain the output of said generator at a predetermined value.

6. A thermoelectric generator comprising a plurality of thermoelectric panels, each said thermoelectric panel comprising at least one thermoelectric junction, said thermoelectric panels being disposed to form a combustion chamber, a fuel combustion burner of the type having a hot gaseous exhaust located adjacent one end of said thermoelectric panels forming the combustion chamber and adapted to heat one end of the thermoelectric panels in said chamber by direct radiation, duct means located in heat exchange relation with said thermoelectric panels, said duct means adapted to receive the hot gaseous exhaust of said burner at a region adjacent the other end of said thermoelectric panels and to pass said hot gaseous exhaust in heat exchange relation with the thermoelectric panels to heat the other end thereof by convective heat transfer.

7. A thermoelectric generator as defined in claim 6 including a plurality of said duct means secured to each of said thermoelectric panels, said duct means being in spaced relation with each other so that said thermoelectric panels receive heat by direct radiation from said burner and by convective heat transfer from the gas passing through said ducts.

References Cited in the file of this patent

UNITED STATES PATENTS

| | | |
|---|---|---|
| 775,188 | Lyons et al. | Nov. 15, 1904 |
| 2,480,404 | Findley et al. | Aug. 30, 1949 |
| 2,563,931 | Harrison | Aug. 14, 1951 |
| 2,906,801 | Fritts | Sept. 29, 1959 |
| 2,938,357 | Sheckler | May 31, 1960 |

FOREIGN PATENTS

| | | |
|---|---|---|
| 87,533 | Germany | Nov. 8, 1895 |